(12) United States Patent
Kim

(10) Patent No.: US 7,164,323 B1
(45) Date of Patent: *Jan. 16, 2007

(54) PHASE SYNCHRONOUS MULTIPLE LC TANK OSCILLATOR

(75) Inventor: Beomsup Kim, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/033,467

(22) Filed: Jan. 7, 2005

Related U.S. Application Data

(63) Continuation of application No. 10/004,521, filed on Nov. 14, 2001, now Pat. No. 6,900,699.

(51) Int. Cl.
*H03B 27/00* (2006.01)

(52) U.S. Cl. .............................. 331/46; 331/2; 331/167; 331/117 R; 331/117 FE

(58) Field of Classification Search .................. 331/46, 331/2, 57, 50, 117 R, 117 FE, 167
See application file for complete search history.

(56) References Cited

U.S. PATENT DOCUMENTS

| 3,355,673 | A  | 11/1967 | Williams et al. ............... 331/45 |
| 3,731,230 | A  | 5/1973  | Cerny, Jr. ................ 331/116 R |
| 5,396,195 | A  | 3/1995  | Gabara .................... 331/113 R |
| 5,561,398 | A  | 10/1996 | Rasmussen ................ 331/36 C |
| 5,561,399 | A  | 10/1996 | Haartsen ........................ 331/57 |
| 5,635,877 | A  | 6/1997  | Monk et al. .................... 331/57 |
| 5,852,385 | A  | 12/1998 | Izumikawa .................... 331/57 |
| 5,892,425 | A  | 4/1999  | Kuhn et al. .................. 336/200 |
| 5,912,596 | A  | 6/1999  | Ghoshal ................. 331/117 R |
| 6,094,103 | A  | 7/2000  | Jeong et al. .................... 331/57 |
| 6,104,253 | A  | 8/2000  | Hall et al. ...................... 331/56 |
| 6,188,291 | B1* | 2/2001 | Gopinathan et al. .......... 331/45 |
| 6,232,847 | B1 | 5/2001  | Marcy, 5th et al. ........... 331/57 |
| 6,417,740 | B1 | 7/2002  | Anh et al. ..................... 331/48 |
| 6,433,653 | B1 | 8/2002  | Matsumura et al. ........ 333/185 |
| 6,724,267 | B1 | 4/2004  | Kim ............................. 331/57 |

FOREIGN PATENT DOCUMENTS

| EP | 0900997    | 8/1998 |
| KR | 10-0278551 | 5/1999 |
| KR | 10-0268050 | 7/1999 |

OTHER PUBLICATIONS

Kim, Jae Joon and Kim, Beomsup, "A Low-Phase-Noise CMOS LC Oscillator with a Ring Structure", Korea Advanced Institute of Science and Technology (KAIST), Taejon, Korea, 2000 IEEE International Solid-State Circuits Conference, 07803-5853-8/00.

* cited by examiner

*Primary Examiner*—Arnold Kinkead
(74) *Attorney, Agent, or Firm*—Philip R. Wadsworth; Charles D. Brown; Kenyon S. Jenckes

(57) ABSTRACT

A phase synchronous multiple LC tank oscillator includes a plurality of oscillator stages configured to oscillate synchronously. The phase of each of the plurality of oscillator stages is substantially the same.

16 Claims, 6 Drawing Sheets

PHASE SYNCHRONOUS MULTIPLE LC TANK OSCILLATOR

CROSS REFERENCE TO RELATED APPLICATIONS

This application is a continuation of U.S. patent application Ser. No. 10/004,521, now U.S. Pat. No. 6,900,699, entitled PHASE SYNCHRONOUS MULTIPLE LC TANK OSCILLATOR filed Nov. 14, 2001, which is incorporated herein by reference for all purposes.

This application is related to U.S. patent application Ser. No. 10/003,729, now U.S. Pat. No. 6,724,267, entitled VOLTAGE CONTROLLED OSCILLATOR filed Nov. 14, 2001, which is incorporated herein by reference for all purposes.

FIELD OF THE INVENTION

The present invention relates generally to voltage controlled oscillators. A phase synchronous multiple LC tank oscillator is disclosed.

BACKGROUND OF THE INVENTION

LC tank oscillators have been used for communication systems, particularly for high frequency LO (local oscillator) signal generation for microwave or radio frequency apparatus. An LC tank circuit includes inductors and capacitors arranged to oscillate by exchanging current or voltage between inductors and capacitors with a finite frequency. Since small resistance in the inductors and capacitors tends to dissipate the energy in the oscillator, the LC tank loses energy and eventually stops oscillating. A negative resistance usually generated by active devices included in the oscillator compensates for energy dissipation caused by resistance and sustains the oscillation. However, even though the resistance is compensated in this manner by the active devices, the resistance still degrades the oscillation quality by affecting the oscillation amplitude, phase noise and oscillation purity (i.e. whether the oscillation has a pure sine wave shape). One measure of quality of oscillation is called the "Quality Factor." The Quality Factor is defined as the ratio of the energy stored in the LC tank to the energy dissipated in the resistor per oscillation cycle.

Thus, it is desirable that inductors used in an LC tank oscillator have minimum resistance. Unfortunately, on chip inductors generally have high resistance. Low quality oscillation generally results due to the substrate resistance and Ohmic resistance of the metal used in on chip inductors. Therefore, the phase noise performance of oscillators using on-chip inductors is poor and generally not suitable for high quality wireless devices such as cellular phones or satellite communication equipment.

What is needed is an oscillator design that will enable on chip inductors to be used for such high quality wireless devices.

SUMMARY OF THE INVENTION

A phase synchronous multiple LC tank oscillator is disclosed. The phase synchronous multiple LC tank oscillator includes at least two oscillators that are configured to oscillate synchronously. In one embodiment, the phase synchronous multiple LC tank oscillator includes a set of four oscillators that are configured to oscillate synchronously. As a result of the synchronous oscillation, the magnetic flux in corresponding inductors that are components of the synchronous oscillators is aligned. As a result, the corresponding inductors may be physically configured so that they are mutually inductive.

It should be appreciated that the present invention can be implemented in numerous ways, including as a process, an apparatus, a system, a device, a method, or a computer readable medium such as a computer readable storage medium or a computer network wherein program instructions are sent over optical or electronic communication links. Several inventive embodiments of the present invention are described below.

In one embodiment, a phase synchronous multiple LC tank oscillator includes a plurality of oscillator stages configured to oscillate synchronously. The phase of each of the plurality of oscillator stages is substantially the same.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An oscillator architecture is disclosed that generates a high quality oscillation signal output using on chip inductors or other low quality inductors. The phase noise performance of the resulting oscillator is improved so that it can meet the high performance requirements for a wireless device. A plurality of synchronous low quality oscillators form a high quality oscillator by synchronizing the oscillation phase with other peer oscillators. Because the oscillations are synchronized, the magnetic flux may be shared among corresponding inductors used in the different oscillators without increasing resistance of the individual inductors.

Phase-synchronous signal addition of multiple oscillator outputs improves phase noise performance because the output signal power increases by 6 dB per each additional oscillator output in phase while the noise power increases by 3 dB per each additional oscillator output. Thus, the disclosed multiple oscillator architecture effectively achieves high purity oscillation even though the individual oscillators are relatively low quality.

Figure 1:
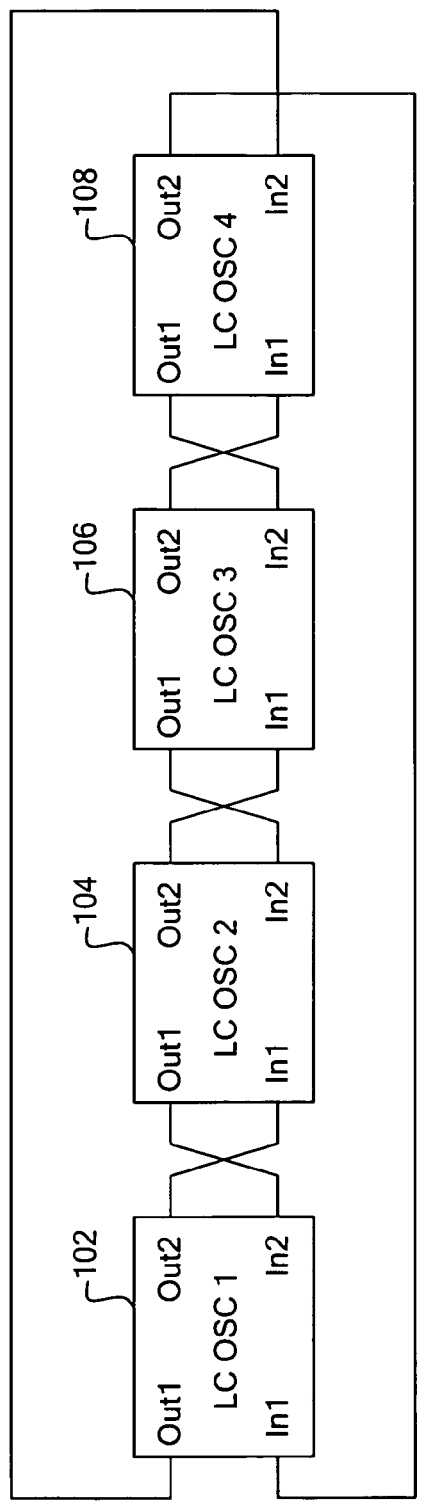
FIG. 1 is a block diagram illustrating an architecture used in one embodiment wherein synchronizing phase is achieved by outputting signals from each oscillator stage into adjacent oscillator stages.

FIG. 1 is a block diagram illustrating an architecture used in one embodiment wherein synchronizing phase is achieved by outputting signals from each oscillator stage into adjacent oscillator stages. The architecture includes four oscillator stages 102, 104, 106 and 108. Each oscillator includes two inputs and two outputs. Each oscillator stage outputs its own output signal to two adjacent oscillator stages and also receives inputs from the two adjacent oscillator stages. For example, oscillator 104 includes a first output that is connected to an input of adjacent oscillator 102 and a second output that is connected to an input of its other adjacent oscillator 106. In addition, oscillator 104 includes a first input that is connected to an output of adjacent oscillator 102 and a second input that is connected to an output of its other adjacent oscillator 106. As a result, all of the oscillators oscillate synchronously.

Figure 2:
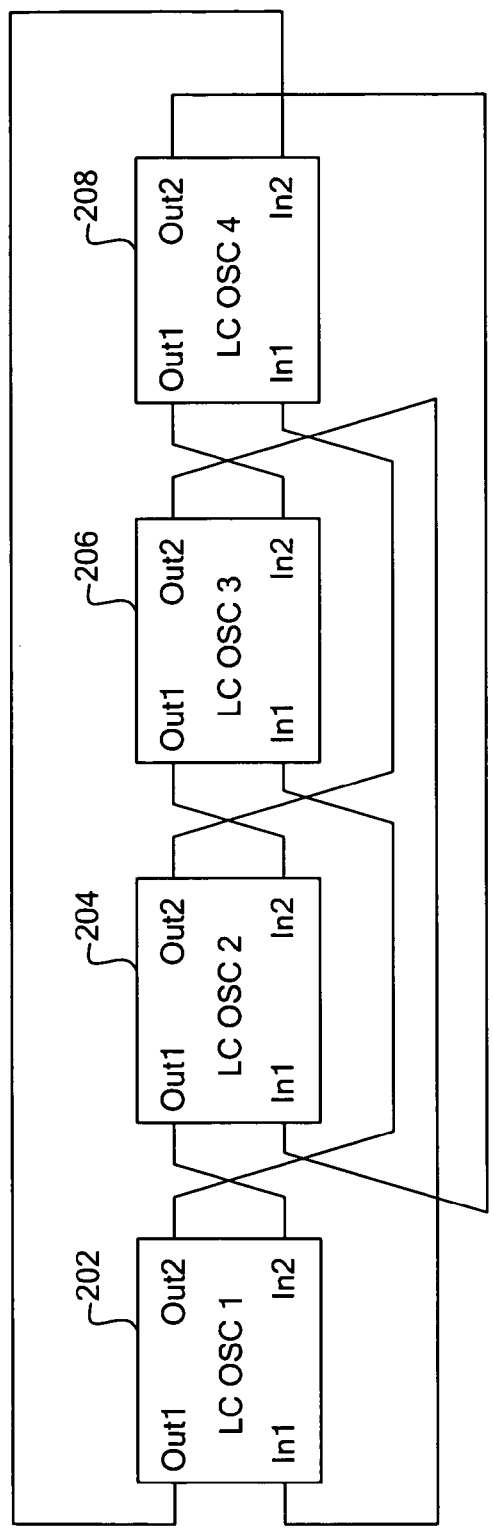
FIG. 2 is a block diagram illustrating an architecture used in one embodiment where synchronizing phase is achieved by outputting signals from each oscillator stage into both adjacent and nonadjacent oscillator stages.

FIG. 2 is a block diagram illustrating an architecture used in one embodiment where synchronizing phase is achieved by outputting signals from each oscillator stage into both adjacent and nonadjacent oscillator stages. The architecture includes four oscillator stages 202, 204, 206 and 208. Each oscillator includes two inputs and two outputs. Each oscillator stage outputs its own output signal to one adjacent oscillator stage and one nonadjacent oscillator stage. For example, oscillator 204 includes a first output that is fed back to an input of oscillator 202 and a second output that is fed forward, skipping a stage, to an input oscillator 206. In addition, oscillator 204 includes a first input that is connected to an output of nonadjacent oscillator 208 and a second input that is connected to an output of adjacent oscillator 206. As a result, all of the oscillators oscillate synchronously.

Figure 3:
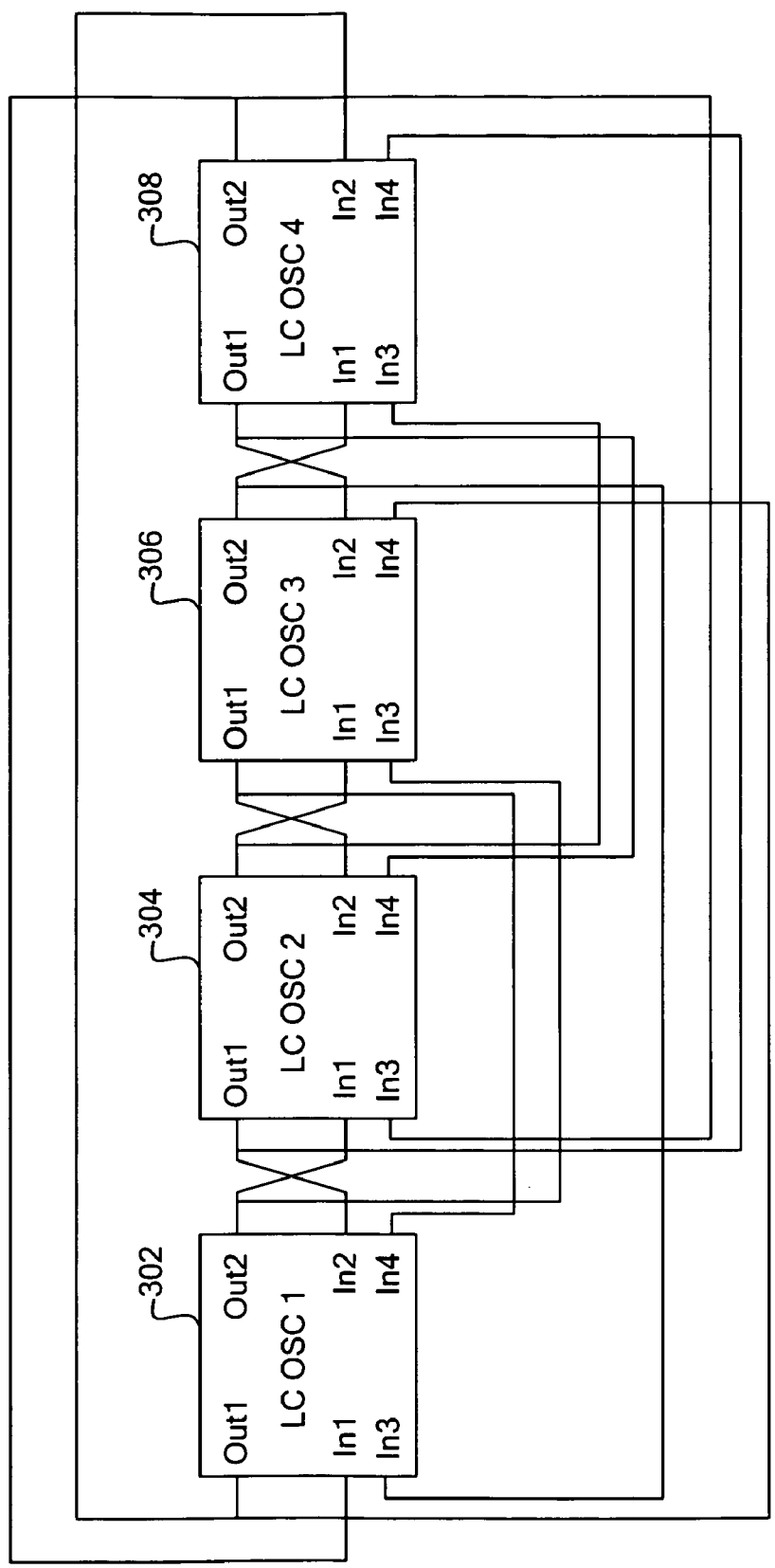
FIG. 3 is a block diagram illustrating an architecture used in one embodiment where synchronizing phase is achieved by having each oscillator stage receive an input from every other oscillator stage.

FIG. 3 is a block diagram illustrating an architecture used in one embodiment where synchronizing phase is achieved by having each oscillator stage receive an input from every other oscillator stage. The architecture includes four oscillator stages 302, 304, 306 and 308. Each oscillator includes four inputs and two outputs that are each split. Each oscillator stage outputs its own output signal every other oscillator stage with one of the other oscillator stages receiving the output twice. For example, oscillator stage 304 includes a first output that is fed to an input of oscillator stage 302 and an input of oscillator stage 308. Oscillator stage 304 also includes a second output that is fed to two inputs of oscillator stage 306. As a result, all of the oscillators oscillate synchronously.

Figure 4A:
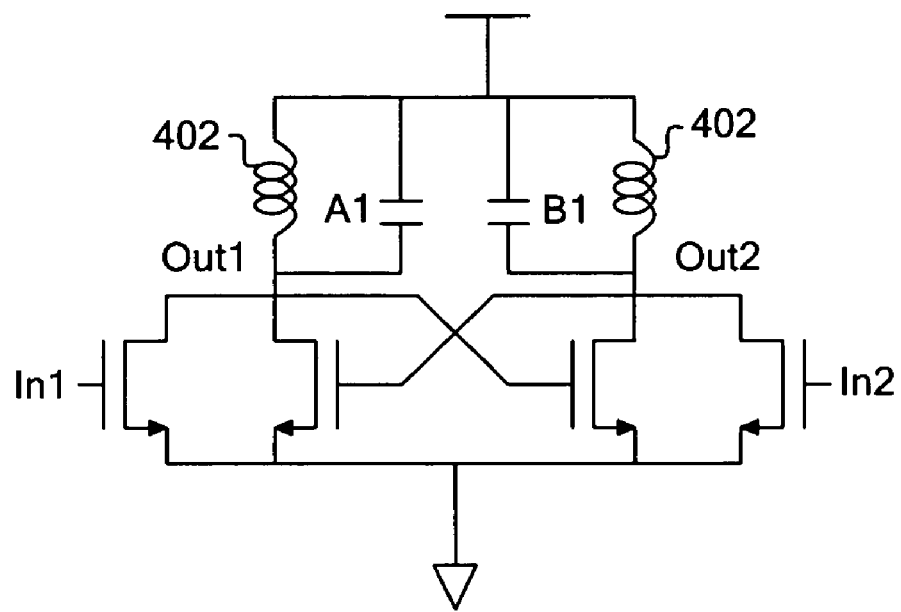
FIG. 4A is a block diagram illustrating an LC tank oscillator used in one embodiment.

FIG. 4A is a block diagram illustrating an LC tank oscillator used in one embodiment. LC tank oscillator stage 400 includes a first inductor 402 and a second inductor 412. In the architectures described above, four substantially identical oscillators are configured according to the various illustrated schemes. Each oscillator stage includes its own two inductors, one corresponding to inductor 402 and one corresponding to inductor 412. In other embodiments, other LC tank configurations are used.

Figure 4B:
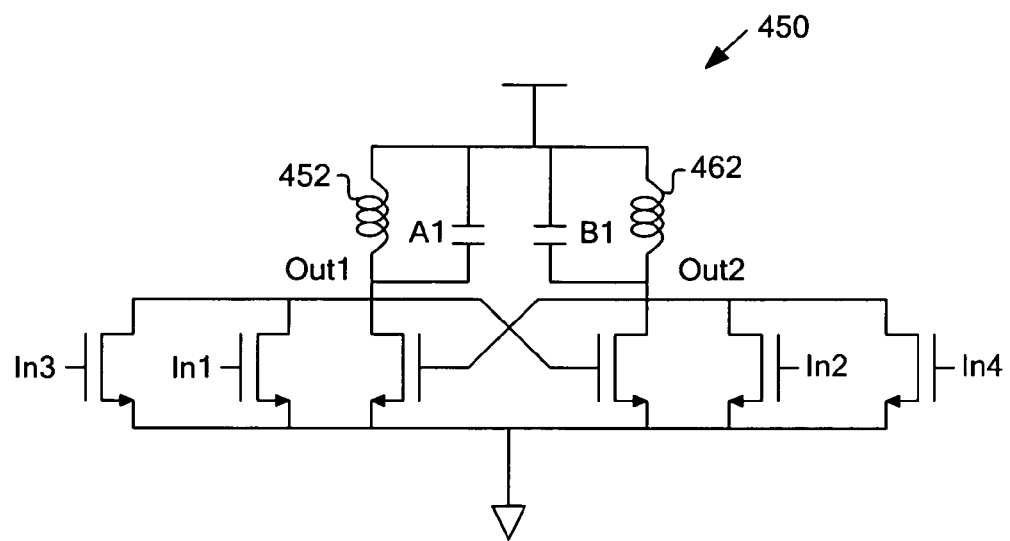
FIG. 4B is a block diagram illustrating an alternative LC tank oscillator used in an embodiment where the oscillator stages each include four inputs.

FIG. 4B is a block diagram illustrating an alternative LC tank oscillator used in an embodiment where the oscillator stages each include four inputs. LC tank oscillator stage 450 includes a first inductor 452 and a second inductor 462. Substantially identical oscillator stages are configured according to a selected multiple oscillator stage structure. Each oscillator stage includes its own two inductors, one corresponding to inductor 452 and one corresponding to inductor 462.

As mentioned above, in most conventional inductors, increasing inductance increases the resistance of the inductor because the length of the coiled wire that comprises the inductor is increased. The increased length metal wire has higher resistance and the quality of the oscillation is not improved. If a phase synchronous multiple tank oscillator architecture is used, then the magnetic flux is generated in the same direction among corresponding inductors in the participating oscillators. If the corresponding inductors are physically arranged so that their fluxes are added, then the mutual inductance among the inductors may have the effect of increasing the effective inductance of each individual inductor without increasing the resistance of the inductor. As a result, the quality of the oscillation generated from the phase synchronous multiple LC tank oscillator may be improved. In addition, if the inductors from the oscillators are overlapped or arranged concentrically, space on the surface of the chip may be saved.

Figure 5:
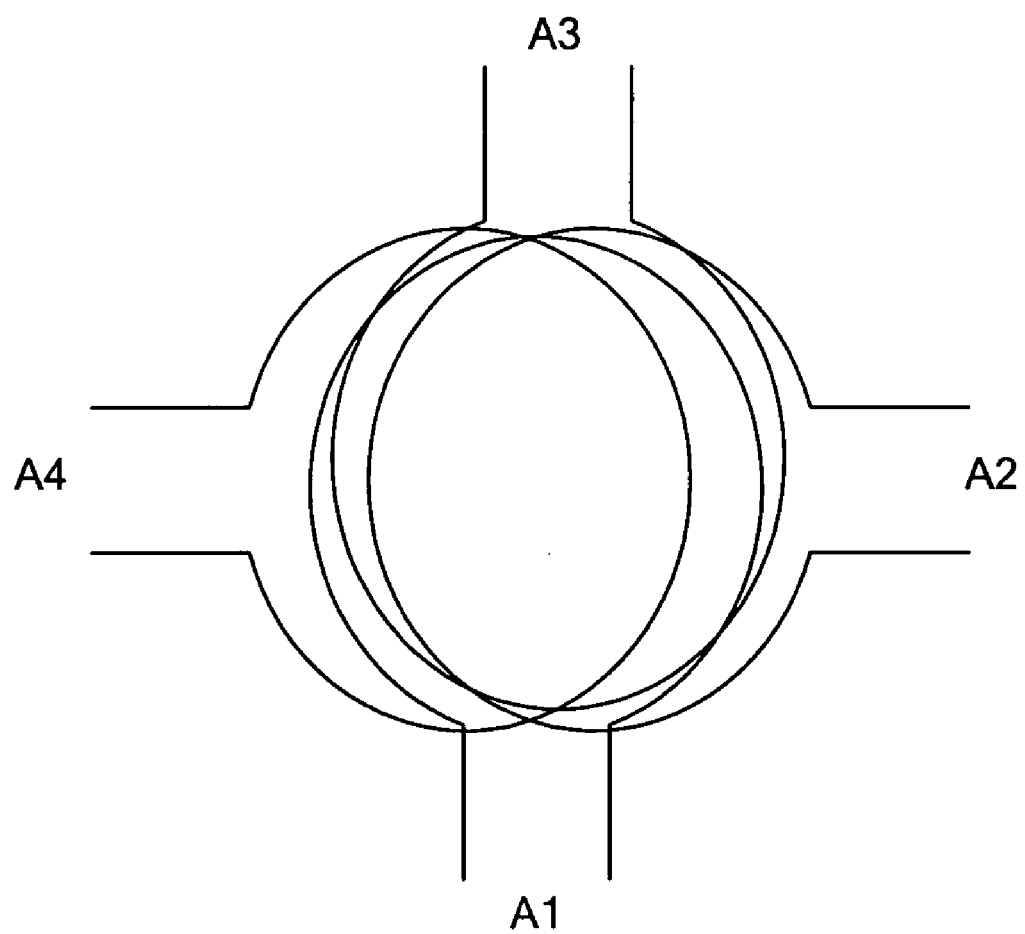
FIG. 5 is a diagram illustrating how corresponding inductors from different oscillator stages are physically configured in one embodiment to increase their mutual inductance by adding their fluxes.

FIG. 5 is a diagram illustrating how corresponding inductors from different oscillator stages are physically configured in one embodiment to increase their mutual inductance by adding their fluxes. As explained above, each of the oscillator stages oscillate synchronously and so the corresponding fluxes are generated in the same direction. Inductors 402, 404, 406, and 408 include coils each having one or more loops. The coils are physically arranged concentrically about a common center, which causes the fluxes to add.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims. For example, several embodiments of a phase synchronous multiple LC tank oscillator have been described wherein four oscillator stages are included. In other embodiments, a different number of synchronous oscillator stages are used. Also, various ways of connecting the oscillators are described that cause the oscillators to oscillate in a synchronous manner. In different embodiments, the oscillators may be connected in a different manner to oscillate synchronously. Furthermore, oscillators having two inputs have been shown in the examples given. In other embodiments, oscillators having more than two inputs are used.

What is claimed is:

1. A phase synchronous multiple LC tank oscillator, comprising:

a plurality of oscillator stages configured to oscillate synchronously; wherein:

each of the plurality of oscillator stages is configured to oscillate;

the plurality of oscillator stages are configured to generate a plurality of oscillator stage outputs;

the plurality of oscillator stage outputs have substantially the same phase.

2. A phase synchronous multiple LC tank oscillator as recited in claim 1 wherein each of the plurality of oscillator stages includes two outputs that are sent to two adjacent oscillator stages and each of the plurality of oscillator stages receive inputs from the two adjacent oscillator stages.

3. A phase synchronous multiple LC tank oscillator as recited in claim 1 wherein the plurality of oscillator stages includes an oscillator stage having a first output that is connected to an input of a first adjacent oscillator stage and a second output that is connected to an input of a second oscillator stage and wherein the oscillator stage further includes a first input that is connected to an output of the first adjacent oscillator stage and a second input that is connected to an output the of the second adjacent oscillator stage.

4. A phase synchronous multiple LC tank oscillator as recited in claim 1 wherein each of the oscillator stages include corresponding inductors that are arranged to be mutually inductive.

5. A phase synchronous multiple LC tank oscillator as recited in claim 1 wherein each of the plurality of oscillator stages has greater than two inputs.

6. A phase synchronous multiple LC tank oscillator as recited in claim 1 wherein each of the plurality of oscillator stages has greater than two outputs.

7. A phase synchronous multiple LC tank oscillator as recited in claim 1 wherein the plurality of oscillator stages includes more than four oscillator stages.

8. A method of configuring a phase synchronous multiple LC tank oscillator, comprising:

providing a plurality of oscillator stages, each of the plurality of oscillator stages being configurable to oscillate and the plurality of oscillator stages being configurable to generate a plurality of oscillator stage outputs;

coupling the plurality of oscillator stages to generate the plurality of oscillator stage outputs; wherein:

the plurality of oscillator outputs have substantially the same phase.

9. A method as recited in claim 8 wherein each of the plurality of oscillator stages includes two outputs that are sent to two adjacent oscillator stages and each of the plurality of oscillator stages receives inputs from the two adjacent oscillator stages.

10. A method as recited in claim 8 wherein the plurality of oscillator stages includes an oscillator stage having a first output that is connected to an input of a first adjacent oscillator stage and a second output that is connected to an input of a second oscillator stage and wherein the oscillator stage further includes a first input that is connected to an output of the first adjacent oscillator stage and a second input that is connected to an output of the of the second adjacent oscillator stage.

11. A method as recited in claim 8 wherein each of the plurality of oscillator stages include corresponding inductors that are arranged to be mutually inductive.

12. A method as recited in claim 8 wherein each of the plurality of oscillator stages has greater than two inputs.

13. A method as recited in claim 8 wherein each of the plurality of oscillator stages has greater than two outputs.

14. A method as recited in claim 8 wherein the plurality of oscillator stages includes more than four oscillator stages.

15. A method as recited in claim 8 wherein a first oscillator stage among the plurality of oscillator stages includes:

a first output connected to a second oscillator stage among the plurality of oscillator stages; and a second output connected to a third oscillator stage among the plurality of oscillator stages.

16. A method of generating an oscillating signal, comprising:

coupling a plurality of phase synchronous LC oscillator stages, each of the plurality of LC oscillator stages being configurable to oscillate and the plurality of LC oscillator stages being configurable to generate a plurality of oscillator stage outputs;

generating the plurality of oscillator outputs; wherein the plurality of oscillator outputs have substantially the same phase.

* * * * *